United States Patent

Pekau et al.

[11] 4,015,248
[45] Mar. 29, 1977

[54] PROCESS FOR RECORDING LOW-FREQUENCY WIDE-BAND SIGNALS ON A THERMOPLASTIC STORAGE MEDIUM

[75] Inventors: Dietlind Pekau, Taufkirchen; Eckhard Storck, Munich, both of Germany

[73] Assignee: Siemens Aktiengesellschaft, Berlin & Munich, Germany

[22] Filed: Mar. 17, 1976

[21] Appl. No.: 667,564

Related U.S. Application Data

[63] Continuation of Ser. No. 521,395, Nov. 6, 1974, abandoned.

[30] Foreign Application Priority Data

Nov. 7, 1973  Germany ........................... 2355702

[52] U.S. Cl. .................. 340/173 TP; 179/100.3 G; 358/129
[51] Int. Cl.² .................. G11C 11/46; H04N 5/82; G11B 7/24
[58] Field of Search ............. 179/100.3 G, 100.1 R, 179/100.1 B; 178/6.6 TP; 250/237; 340/173 TP, 173 LS; 346/74 TP

[56] References Cited

UNITED STATES PATENTS

| | | | |
|---|---|---|---|
| 3,055,006 | 9/1962 | Dreyfoos | 340/173 LS |
| 3,137,762 | 6/1964 | Baumgartner | 178/6.6 TP |
| 3,158,430 | 11/1964 | McNaney | 346/74 TP |
| 3,281,798 | 10/1966 | Glenn | 340/173 TP |
| 3,312,955 | 4/1967 | Lamberts | 179/100.3 G |
| 3,732,363 | 5/1973 | Glenn | 179/100.3 G |

OTHER PUBLICATIONS

H. Kiemle and Dieter Ross, "Ein Fuhring In Die Tecknik Der Holographie", Paragraph 6.61, p. 217, Akademsche Verlagsgesellschaft, Frankfurt, 1969.

Primary Examiner—Daryl W. Cook
Assistant Examiner—Robert M. Kilgore
Attorney, Agent, or Firm—Hill, Gross, Simpson, Van Santen, Steadman, Chiara & Simpson

[57] ABSTRACT

A process for recording low-frequency, wide-band signals on a thermoplastic storage medium to obtain an improved signal-to-noise ratio characterized by exposing the thermoplastic storage medium with the information to be recorded and either simultaneously or in a sequential relation imposing a lattice signal onto the storage medium. In one embodiment of the process, the lattice signal is obtained by utilizing an optical grating which modulates light passing therethrough with the lattice signal. If the lattice signal is to be imposed simultaneously with the exposing of the information, the light containing the information is passed through the optical grating to have the lattice signal imposed thereon. In another embodiment, the lattice signal is imposed on the storage medium electronically by utilizing spaced electrode pairs which are energized either simultaneously with the exposing of the thermoplastic or in a sequential relation therewith.

6 Claims, 2 Drawing Figures

PROCESS FOR RECORDING LOW-FREQUENCY WIDE-BAND SIGNALS ON A THERMOPLASTIC STORAGE MEDIUM This is a continuation of application Ser. No. 521,395, filed Nov. 6, 1974, now abandoned.

BACKGROUND OF THE INVENTION

The present invention is directed to a process for recording low-frequency, wide-band signals on thermoplastic storage medium and particularly for recording electrical interference signals from acoustic holograms on thermoplastic material.

The use of thermoplastic material as a storage medium for recording holograms is known. For example, the process for recording holograms on a thermoplastic storage medium is discussed in a German Language Book, Kiemle and Roess *Einfuehrungin Die Technik Der Holografie*, Akademische Verlagsgesellschaft Frankfurt-Main, 1969, page 217. To use the thermoplastic material, it is usually applied in a thin layer on a transparent photo conducting carrier, such as photo conductive glass. The outer surface of the thermoplastic material is sensitized by providing it with a uniformly distributed positive or negative charge by means of a corona charge.

During exposure, the photo conductive carrier becomes conductive in those areas or points on which light falls but at the unexposed points it remains in an insulative or nonconductive condition. Thus, the exposing creates a charge profile corresponding to the light interference pattern projected onto the storage medium.

To develop the thermoplastic material, it is heated to a temperature which is either a softening point or partial melting point. As it reaches its melting point, those particular areas which have charges on opposite surfaces which charges have opposite polarity are drawn together by the attraction of the charges to cause the formation of a surface relief corresponding to the charge distribution while those areas without the charge pattern remain substantially unaffected. Upon cooling, the surface relief formed by the distribution of charge particles is fixed and in this way a surface-phase hologram can be recorded on the thermoplastic storage material.

The information or hologram can be erased from the storage material if the material is heated to above the softentng point. At this temperature, the surface tension of the material forms a smooth surface layer. After the erasing step, the synthetic material can be used again for recording other data.

In comparison to other holographic recording materials, thermoplastic materials have some disadvantages. For example, they ony record a limited spatial frequence band around a center frequency. The band width, which is mainly dependent upon the thickness and surface tension of the thermoplastic material and on the charge distribution, influences the holographic recording depending upon the spatial frequency.

Sonar signals are produced in acoustic holography. For example, the amplitude and phase distribution of a sound field, which is produced by acoustically, coherently irradiated object, is scanned in a receiving plane by a transducer which converts the sound field to electrical signals. A coherent reference signal is added to the received signal and the electrical interference signal formed in this way is conducted to electro-optical transducer, for example an oscilloscope, which converts the electrical signals into a visual presentation. The sound receiver can be either a matrix of sound transducers which are electronically scanned or an individual sound transducer which is moved mechanically over the receiving plane and thus scans the sound field row-by-row in predetermined intervals.

If acoustical holograms are to be portrayed on thermoplastic material for the purpose of an optical short-time reconstruction, a problem occurs in that the data which is to be recorded is generally of very low frequency. Whereas approximately 500 lines/mm can usually be recorded by holographic recording on a thermoplastic material, one line/mm is an average for the recording of acoustical holograms on thermoplastic storage material. Since the resonance frequency of thermoplastic storage material is at considerably higher frequencies, a very poor signal-to-noise ratio will be obtained.

SUMMARY OF THE INVENTION

The present invention is directed to process for recording of low-frequency, wide-band signals on a thermoplastic storage material, and particularly, suitable for recording of electrical interference signals of acoustic holograms. The process provides an improved signal-to-noise ratio. To accomplish these aims, a process of recording on thermoplastic storage material is utilized in which the information to be recorded in the form of electrical signals is converted to optical signals by an electro-optical transducer and the improvements comprise exposing the thermoplastic storage material with the optical information on the electro-optical transducer and imposing a lattice signal on the storage medium prior to developing the storage medium. The lattice signal may be produced optically using an optical grating or may be produced electronically utilizing spaced electrode pairs adjacent to the thermoplastic material. The lattice signal may be imposed on the thermoplastic material simultaneously with the exposing of the material with the information to be recorded or sequentially before or after the step of exposing.

DESCRIPTION OF THE PREFERRED EMBODIMENT

Figure 1:
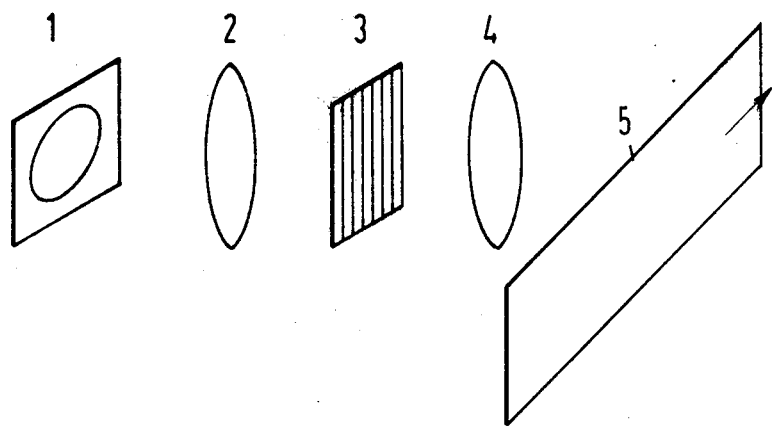
FIG. 1 is a schematic presentation of an arrangement for accomplishing one embodiment of the process of the present invention.

The principles of the present invention are particularly useful when incorporated in a process for recording low-frequency, wide-band signals, such as the signal present in sonar or acoustical holograms, on a thermoplastic medium. To accomplish this process, the data to be recorded is provided on an electro-optical transducer, such as oscilloscope 1, which converts the electrical signals formed by combining a reference signal to the signals received during scanning of the sound field into a visual presentation.

The information visually portrayed on the electro-optical transducer 1 is focused by a lens 2 and projected through an optical grating 3. The grating modulates a lattice signal onto the light pattern which is then received by lens 4 and projected onto a thermoplastic material which may be in the form of tape which is moved in the direction of the arrow. The thermoplastic material 5 has been charged in accordance with conventional procedures for recording holograms on the thermoplastic material. The combined signal from the optical grating and the information signal causes changes in the charged distribution on the thermoplastic material so that when heated, the information will be recorded in the surface thereof such as a surface relief hologram.

The optical grating 3 should be of a design and construction so that the sum or difference of the lattice signal imposed on the light and the signal frequency of the information to be recorded corresponds to the resonance frequency of the thermoplastic material being employed as the storage medium 5. As illustrated, the product of the hologram transmission and the lattice transmission are simultaneously projected onto the thermoplastic material to expose the material with both transmissions simultaneously. On reconstruction of the acoustic holograms which have been recorded in this manner, the data or information of the acoustic-hologram is obtained sharply and spatially separated from the reconstructed lattice information. While the arrangement in FIG. 1 was described as simultaneously exposing and imposing both transmissions, the lattice signal from the optical grating 3 can be imposed on the storage material 5 in a sequential relation either before or after the exposing of the material with the information from the electro-optical transducer. However, whether the lattice signal and the information are simultaneouly applied to the tape or sequentially applied, both are applied prior to development of the exposed thermoplastic material 5.

Figure 2:
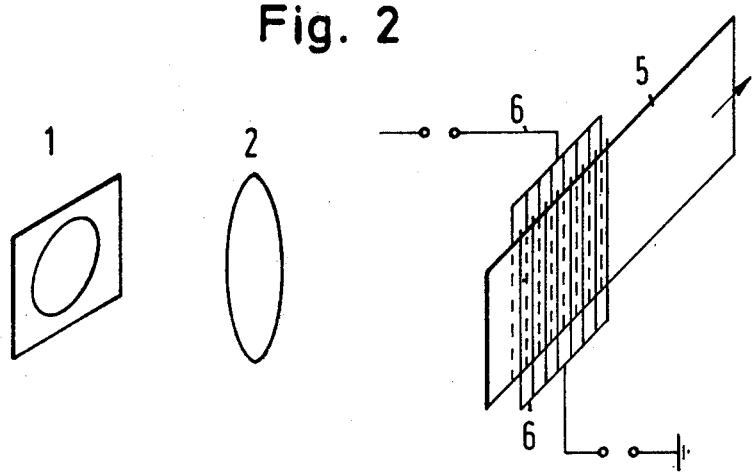
FIG. 2 is a schematic presentation of an arrangement for accomplishing another embodiment of the process of the present invention.

Instead of optically imposing the lattice transmission on the thermoplastic storage medium 5, a lattice structure can be produced electronically on the thermoplastic material as illustrated in the arrangement of FIG. 2 by applying a voltage to affect selected portions of the charge distribution on the material 5. To accomplish this, a suitable electrode device 6, which has spaced electrodes or segments whose spacing is determined by the lattice structure, is arranged with the thermoplastic material passing between the spaced pairs of electrodes. The lattice structure is imposed on the material 5 by applying a suitable voltage to the electrodes 6 either simultaneous with the exposing of the data from the electro-optical transducer 1 which is projected by the lens 2 onto the material 5 or in a sequential relation thereto. Then the material 5 is heated and cooled to develop the thermoplastic material 5.

The interval of the individual lattice line and thus the spacing between the segments of the electrodes 6, one from the other, should correspond approximately to double the thickness of the thermoplastic material. It is noted that the thickness of the thermoplastic material fundamentally determines the resonance frequency of the material.

Since the process enables selecting different lattice spacings, the process provides a free selection of available thermoplastic materials. Thus, it is possible to use thermoplastic materials of a higher center frequency in which the recording band width is also correspondingly greater. This is particularly advantageous in the case of holographic recording since hologram data extends over a large band-width which then falls easily into the band width of the selected thermoplastic material.

In addition to recording acoustic holograms, television pictures, which are known to have similar low frequencies, can be projected by this process on the storage medium from the screen.

Although various minor modifications may be suggested by those versed in the art, it should be understood that we wish to employ within the scope of the patent warranted hereon all such modifications and suggestions as reasonably and properly come within the scope of our contribution to the art.

We claim:

1. In a process for recording low-frequency, wide-band signals on a thermoplastic storage medium having a resonance frequency considerably higher than the frequency of the signal being recorded and particularly adapted for recording electrical interference signals of sonar holograms on the storage medium, which process includes providing a thermoplastic storage medium on a transparent photoconducting carrier, sensitizing the thermoplastic material by applying a charge of uniform distribution to a surface thereof, converting the electrical signals of information to be recorded with an electro-optical transducer into optical signals, exposing the thermoplastic medium with the optical signals to create a charge profile corresponding to the optical signals and developing the exposed storage medium by heating the medium to at least a softening point so that a surface relief corresponding to the charge profile is formed in the surface, the improvement comprising imposing a lattice signal on the storage medium prior to developing the storage medium, so that the sum or difference of the frequencies of the optical signals and the lattice signal correspond to the resonance frequency of the storage medium.

2. In a process according to claim 1, wherein the step of imposing a lattice signal comprises providing an optical grating, directing light through the optical grating to modulate the lattice signal thereon and then exposing the storage medium sequentially to the step of exposing the storage medium with the optical signals provided by the transducer.

3. In a process according to claim 1, wherein the step of imposing a lattice signal includes providing an optical grating, projecting the optical signal from the transducer through the optical grating to modulate the lattice signal thereon and to simultaneously expose the thermoplastic medium with the optical signal and the lattice signal.

4. In a process according to claim 1, wherein the step of imposing the lattice signal includes providing a plurality of spaced electrode pairs adjacent the storage medium and energizing the electrodes to impose the lattice signal on the storage medium.

5. In a process according to claim 4, wherein the step of energizing is simultaneous with the step of exposing the storage medium with the optical signals to be recorded thereon.

6. In a process according to claim 4, wherein the step of imposing occurs in a sequential relationship with the step of exposing the storage medium with the optical signals to be recorded thereon.

* * * * *